(12) United States Patent  
McGuire et al.

(10) Patent No.: US 9,291,684 B2  
(45) Date of Patent: Mar. 22, 2016

(54) LOGIC CAPABLE POWER MODULE

(71) Applicant: Rosemount Inc., Chanhassen, MN (US)

(72) Inventors: Chad Michael McGuire, Shakopee, MN (US); Kelly Michael Orth, Apple Valley, MN (US); Theodore Henry Schnaare, Carver, MN (US)

(73) Assignee: Rosemount, Inc., Chanhassen, MN (US)

( * ) Notice: Subject to any disclaimer, the term of this patent is extended or adjusted under 35 U.S.C. 154(b) by 204 days.

(21) Appl. No.: 13/930,700

(22) Filed: Jun. 28, 2013

(65) Prior Publication Data

US 2015/0002185 A1  Jan. 1, 2015

(51) Int. Cl.
 *G01R 31/40* (2014.01)
 *G01R 31/36* (2006.01)
 *G01F 1/30* (2006.01)
 *G01D 21/00* (2006.01)

(52) U.S. Cl.
 CPC ............ *G01R 31/40* (2013.01); *G01R 31/3679* (2013.01); *G01D 21/00* (2013.01); *G01F 1/30* (2013.01)

(58) Field of Classification Search
 CPC ....... G01R 31/40; G01R 31/3679; G06F 1/30
 USPC ................ 324/378–400, 403–450, 500, 537, 324/764.01
 See application file for complete search history.

(56) References Cited

U.S. PATENT DOCUMENTS

| 4,791,362 A * | 12/1988 | Philpot ................ G01R 22/065 324/142 |
| 5,440,590 A | 8/1995 | Birchler et al. |
| 5,481,571 A | 1/1996 | Balachandran et al. |
| 5,561,673 A | 10/1996 | Takai et al. |
| 5,612,580 A * | 3/1997 | Janonis et al. .......... H02J 9/062 307/64 |
| 5,952,963 A | 9/1999 | Shen et al. |
| 6,067,449 A | 5/2000 | Jager |
| 6,114,955 A | 9/2000 | Brunius et al. |
| 6,167,258 A | 12/2000 | Schmidt et al. |

(Continued)

FOREIGN PATENT DOCUMENTS

| EP | 0 712 550 B1 | 9/2001 |
| EP | 1 099 316 B1 | 4/2003 |

(Continued)

OTHER PUBLICATIONS

KR 1020100004288 (Publication No. 1020110084633, Application No. 1020100004288; See original copy provided by applicant for further clarification), Machine Translation, Jul. 26, 2011.*

(Continued)

*Primary Examiner* — Huy Q Phan
*Assistant Examiner* — Raul Rios Russo
(74) *Attorney, Agent, or Firm* — Kinney & Lange, P.A.

(57) ABSTRACT

A wireless field device assembly comprises a process sensor, a housing, a transmitter, and a power module. The process sensor is configured to monitor a process variable and produce a sensor signal. The housing encloses an interior space of the wireless field device. The transmitter is enclosed within the interior space, and is configured to process the sensor signal. The power module is configured to be housed in the interior space, and comprises an energy storage device, a connection to a local power source, and a processor configured to provide the transmitter with a diagnostic report of the energy storage device and the local power source.

25 Claims, 7 Drawing Sheets

(56) References Cited

U.S. PATENT DOCUMENTS

| | | |
|---|---|---|
| 6,201,472 B1 | 3/2001 | Linford et al. |
| 6,330,433 B1 | 12/2001 | Jager |
| 6,456,675 B2 | 9/2002 | Wagner et al. |
| 6,762,686 B1 | 7/2004 | Tabe |
| 6,947,716 B2 | 9/2005 | Ono |
| 6,963,307 B2 | 11/2005 | Mohammadi |
| 7,119,745 B2 | 10/2006 | Gaucher et al. |
| 7,173,574 B2 | 2/2007 | Koide |
| 7,212,838 B2 | 5/2007 | Raghothaman |
| RE40,111 E | 2/2008 | Sanderford et al. |
| 7,463,199 B2 | 12/2008 | Soler Castany et al. |
| 7,489,948 B2 | 2/2009 | Taromaru et al. |
| 7,659,812 B2 | 2/2010 | Yegin et al. |
| 7,680,460 B2* | 3/2010 | Nelson et al. ............ 455/67.11 |
| 8,005,632 B2* | 8/2011 | Zettel et al. ............ G01R 35/00 702/117 |
| 8,014,744 B1 | 9/2011 | Kopikare et al. |
| 8,527,240 B2* | 9/2013 | Scheid et al. ............ 702/188 |
| 2009/0024858 A1 | 1/2009 | Hijazi et al. |
| 2009/0295648 A1 | 12/2009 | Dorsey et al. |
| 2010/0120415 A1 | 5/2010 | Urquhart et al. |
| 2012/0191294 A1 | 7/2012 | Boiron et al. |
| 2013/0107406 A1* | 5/2013 | Johnson ............ H02H 3/202 361/84 |
| 2013/0132010 A1 | 5/2013 | Winger et al. |
| 2013/0344818 A1* | 12/2013 | McGuire ............ G01D 21/00 455/73 |
| 2014/0088893 A1* | 3/2014 | McGuire ............ G01D 21/00 702/58 |
| 2015/0140379 A1* | 5/2015 | Yau ............ H01M 10/48 429/90 |

FOREIGN PATENT DOCUMENTS

| | | |
|---|---|---|
| EP | 1 569 361 B1 | 5/2010 |
| JP | 2012154839 A | 8/2012 |
| KR | 1020110084633 A | 7/2011 |
| WO | WO 99/25077 A1 | 5/1999 |

OTHER PUBLICATIONS

International Search Report and Written Opinion from PCT Application Serial No. PCT/US2014/039752; dated Sep. 24, 2914, 16 pages.

* cited by examiner

FIG. 5

LOGIC CAPABLE POWER MODULE

BACKGROUND

The present invention relates generally to industrial process field devices, and more particularly to a hybrid power module for powering a wireless industrial process field device.

The term "field device" covers a broad range of process management devices that measure and control parameters such as pressure, temperature, and flow rate. Many field devices are transmitters which act as communication relays between a transducer for sensing or actuating an industrial process variable, and a remote control or monitoring device such as a computer in a control room. The output signal of a sensor, for example, is generally insufficient to communicate effectively with a remote control or monitoring device. A transmitter bridges this gap by receiving communication from the sensor, converting this signal to a form more effective for longer distance communication (for example, a modulated 4-20 mA current loop signal, or a wireless protocol signal), and transmitting the converted signal to the remote control or monitoring device.

Field devices are used to monitor and control a variety of parameters of industrial processes, including pressure, temperature, viscosity, and flow rate. Other field devices actuate valves, pumps, and other hardware of industrial processes. Each field device typically comprises a sealed enclosure containing actuators and/or sensors, electronics for receiving and processing sensor and control signals, and electronics for transmitting processed sensor signals so that each field device and industrial process parameter may be monitored remotely. Large scale industrial manufacturing facilities typically employ many field devices distributed across a wide area. These field devices usually communicate with a common control or monitoring device, allowing industrial processes to be centrally monitored and controlled.

Field devices increasingly use wireless transceivers to communicate with centralized control or monitoring systems. Wireless devices extend the reach of control or process monitoring systems beyond that of wired devices to locations where wiring may be difficult and expensive to provide. In some cases wireless field devices may be powered by direct electrical connection to power utilities such as 120V AC utilities, or powered data. More often, however, power utilities are not located nearby or cannot readily be installed in hazardous locations where instrumentation and transducers must operate. Accordingly, field devices are often locally powered by power sources with limited capacity, either stored, as in the case of a long-life battery, or produced, as in the case of a solar panel. Batteries are expected to last more than five years and preferably last as long as the life of the product. Because local power sources have limited capacities, the use of lower power electronics and RF radios is frequently essential for many wireless field devices.

Many field device designs enclose an attached battery under a cover of the sealed enclosure of the field device. Other field devices utilize power from external sources such as solar panels, energy harvesters such as vibrational or thermo-electric scavengers, or a nearby utility grid connection. Each method of powering a wireless field device conventionally requires a different wiring terminal interface. Field devices which run partly or entirely on battery power typically incorporate terminal blocks which provide contact points to an attached battery. Field devices which run on grid power, by contrast, include terminal blocks which provide wired connections for grid power (typically via screw terminals), and which condition grid power for use by the field device. Terminal blocks are often removable, allowing a single field device to be configured for different power sources by swapping in one or another source-specific terminal block. Solar panels, vibrational energy scavenging systems, and other types of local power modules may all use different terminal blocks.

Wireless transmitter field devices broadcast periodic signals corresponding to sensed parameters. Battery-powered transmitters are typically expected operate for five or more years between battery replacements. Depending on the application, existing systems can operate for this period of time while transmitting as often as once every four seconds. Faster update rates are desirable for many industrial applications, but necessitate greater power draw which significantly reduces battery life.

Energy harvesting systems such as solar panels and vibrational or thermoelectric scavengers produce power highly dependent on location and application. Vibrational scavengers can be highly efficient energy sources in areas with high amplitude continuous vibration, for instance, but may not be practical or sufficient in areas with low amplitude or intermittent vibration. Furthermore, while batteries and supercapacitors ordinarily continue to provide power while discharging, energy harvesting systems may experience unpredictable drops in power production, resulting in fluctuating levels of power depending on environmental conditions. Solar panels, for instance, produce no power in the dark, and vibrational scavengers produce no power when attached structures (e.g. motors) are still.

SUMMARY

The present invention is directed toward a wireless field device assembly comprising a process sensor, a housing, a transmitter, and a power module. The process sensor is configured to monitor a process variable and produce a sensor signal. The housing encloses an interior space of the wireless field device. The transmitter is enclosed within the interior space, and is configured to process the sensor signal. The power module is configured to be housed in the interior space, and comprises an energy storage device, a connection to a local power source, and a processor configured to provide the transmitter with a diagnostic report of the energy storage device and the local power source.

DETAILED DESCRIPTION

The present invention is a power module for an industrial wireless field device. According to one embodiment, this power module includes both an energy storage device such as a battery or a supercapacitor, and power conditioning circuitry for an external power source such as an energy harvesting source. The power module separately processes voltage readings from the energy storage device and the external power source, and provides the wireless field device or a control or monitoring system with a diagnostic report generated using this voltage information.

Figure 1:
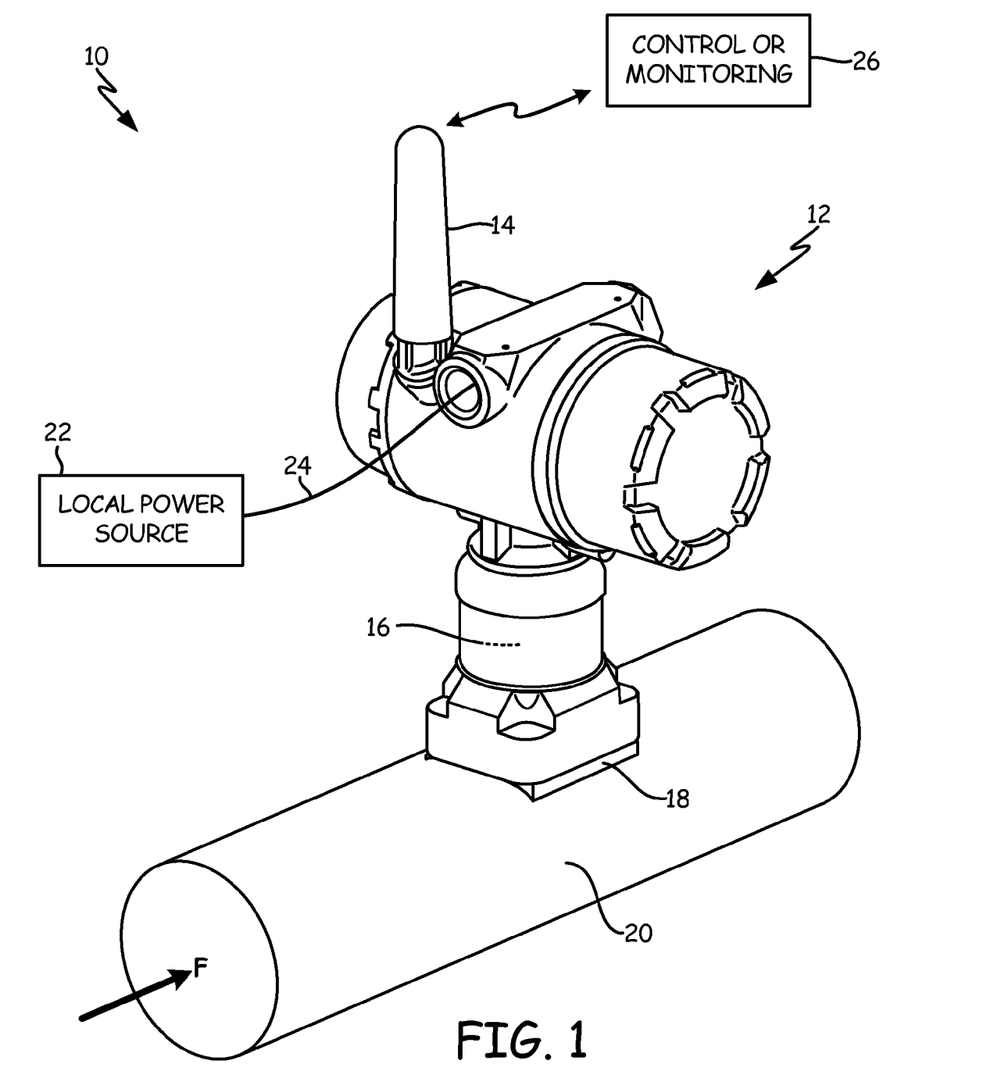
FIG. 1 is a representative diagram of a process monitoring and control system including featuring a wireless field device.

FIG. 1 depicts process measurement or control point 10, comprising wireless field device 12 (with antenna 14), transducer 16, process connection 18, process piping 20, local power source 22, and power connection 24. Wireless field device 12 connects via antenna 14 to control or monitoring system 26.

Process piping 20 carries flow F of process fluid. Wireless field device 12 may be a process transmitter configured to receive, process, and transmit signals from one or more sensors configured to measure parameters of this process fluid. Alternatively, field device 12 may be a wireless controller configured to command a process actuator such as a valve or pump in response to signals from control or monitoring system 26. Transducer 16 is one such sensor or actuator in contact with fluid flow F via process connection 18. Process connection 18 may be a parallel or in-line connection to fluid flow F, depending on the particular industrial application and the parameter measured or actuated by transducer 16. Although only one transducer 16 is shown in FIG. 1, some embodiments of process measurement or control point 10 may include multiple sensors and/or actuators connected to wireless field device 12.

In some embodiments, transducer 16 is a sensor which provides sensor readings to field device 12 for processing and transmission to control or monitoring system 26. In other embodiments, transducer 16 is an actuator which actuates a change on the process fluid in response to signals received from control or monitoring system 26 by field device 12. Although further description hereinafter will focus on the embodiment wherein transducer 16 comprises a sensor, a person skilled in the art will understand that the invention could equally be applied to actuator systems.

Transducer 16 is secured to process piping 20 via process connection 18, and measures one or more parameters of the process fluid, such as flow rate, viscosity, temperature, or pressure. In the depicted embodiment transducer 16 is housed inside field device 12, but alternative embodiments may have transducers located separately from field device 12 and connected to field device 12 by wire. A sensor signal from transducer 16 is sent (e.g. as an analog voltage value or a digital signal) to processing and transmission electronics within field device 12 (see FIGS. 2a and 2b). The particular form of transducer 16 may vary depending on the parameter sensed; in some cases process connection 18 may be configured such that transducer 16 extends into process flow F, within process piping 20. Field device 12 receives and digitizes (if necessary) process signals from transducer 16, and transmits process messages containing process information to control or monitoring system 26 via antenna 14. Antenna 14 is shown as a single antenna, but may comprise a plurality of diverse antennas in an array. Field device 12 may transmit signals directly to control or monitoring system 26, or may transmit signals via an intermediate mesh or hub-and-spoke network. In some embodiments, field device 12 may utilize WirelessHART (IEC 62591) or Fieldbus (IEC 61158) protocols. Control or monitoring system 26 may be a centralized system which receives sensor data from and/or broadcasts actuator data to a plurality of field devices in a wireless field device network. Control or monitoring system 26 may be located on-site with the wireless field device network, or may be located at a remote control room.

Field device 12 includes electronics which process and transmit signals from transducer 16 (or to transducer 16, in the case of an actuator system), as discussed in greater detail below. Both signal processing and signal transmission require energy, which is supplied by a power module as described below with respect to FIGS. 2a and 2b. This power module includes both an internal energy storage device such as a battery or a supercapacitor, and a hookup to local power source 22 over power connection 24. Local power source 22 may, for instance, be a solar cell, an energy harvester such as a vibrational or thermo-electric scavenger, or a utility power grid. Although FIG. 1 depicts local power source 22 as a an external power source situated outside of field device 12, some embodiments of local power source 22 may fit inside field device 12, as described below with respect to FIG. 2b.

Figure 2A:
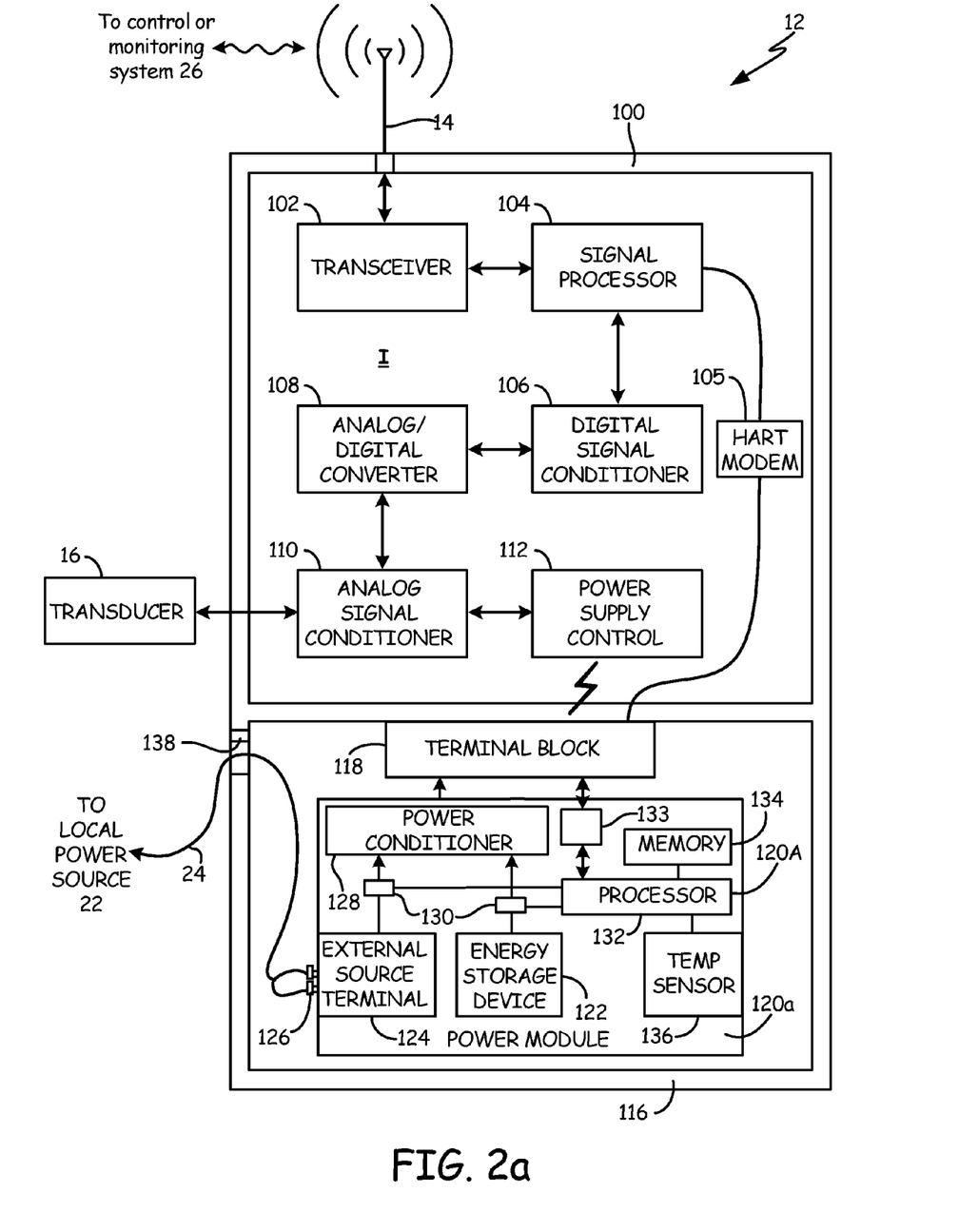
FIG. 2a is a schematic block diagram of the wireless field device of FIG. 1.
Figure 2B:
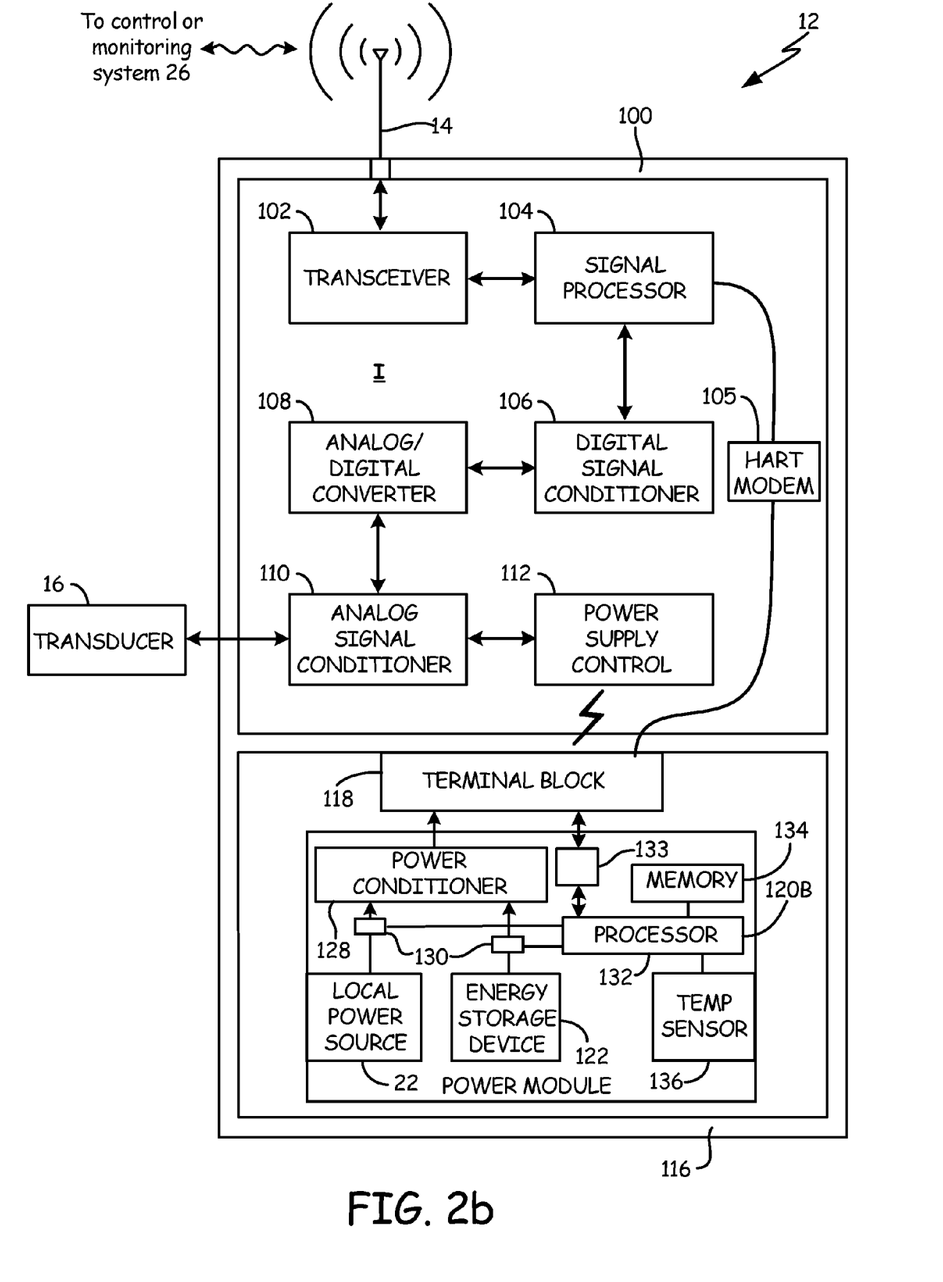
FIG. 2b is a schematic block diagram of an alternative wireless field device according to the present invention.

FIGS. 2a and 2b depict embodiments of field device 12 wherein local power source 22 is external (FIG. 2a) and internal (FIG. 2b) to field device 12. The embodiments of FIGS. 2a and 2b differ only in the composition of power module 120, embodied in FIG. 2a as power module 120A, and in FIG. 2b as power module 120B. The designation "power module 120" is used herein to refer equivalently to power module 120A and power module 120B, where the distinction between embodiments is not relevant.

FIGS. 2a and 2b focus on the embodiment of field device 12 which receives and transmits sensor signals to control or monitoring system 26, rather than the embodiment which actuates process machinery based on signals from control or monitoring system 26. As discussed above, power module 120 could be applied to either type of system, as well as field devices which perform both functions.

FIG. 2a is a schematic block diagram of field device 12, illustrating one embodiment of antenna 14, transducer 16, casing or housing 100, transceiver 102, signal processor 104, HART modem 105, digital signal conditioner 106, analog/digital converter 108, analog signal conditioner 110, power supply control 112, cover 116, terminal block 118, and power module 120A. Power module 120A comprises energy storage device 122, external source terminal 124 (with terminal screws 126), power conditioner 128, voltage sensors 130, power processor 132, HART modem 133, memory 134, and temperature sensor 136. Power connection 24 passes through power conduit 138 to connect local power source 22 to terminal screws 126 of external source terminal 124. FIG. 2b is a schematic block diagram of an alternative embodiment of field device 12 wherein power module 120A is replaced by power module 120B. Power module 120B incorporates local power source 22 internally, thus obviating the need for external source terminal 124, terminal screws 126, power connection 24, and power conduit 138. The embodiments depicted in FIGS. 2a and 2b are otherwise identical. In the depicted embodiments, power module 120 is situated in receptacle R defined by housing 100 and cover 116.

Field device 12 may be exposed to extreme temperatures and hazardous environments. Field device 12 therefore includes casing or housing 100 to enclose and protect electronics in interior region I. Casing or housing 100 is a rigid, durable body which may be sealed against the environment to protect transceiver 102, signal processor 104, digital signal conditioner 106, analog/digital converter 108, analog signal conditioner 110, and power supply control 112 from degradation or damage. Casing or housing 100 interfaces with cover 116 to enclose receptacle R, which protects and houses removable components such as power module 120. Casing or housing 100 and cover 116 may likewise form an environmental seal, thereby protecting components located in receptacle R from harmful environmental effects. In some embodiments the seal between casing or housing 100 and cover 116 may adequately protect components in interior region I (i.e. transceiver 102, signal processor 104, digital signal conditioner 106, analog/digital converter 108, analog signal conditioner 110, and power supply control 112), such that casing or housing 100 need not fully enclose interior region I, since the combination of casing or housing 100 and cover 116 will shield these components from environmental damage, so long as cover 116 is attached.

According to one embodiment, transceiver 102 is a signal transmitter/receiver which transmits and receives wireless signals via antenna 14. Signal processor 104 is a logic-capable data processor such as a microprocessor. In the depicted embodiment, HART modem 105 is a modulator-demodulator configured to extract a diagnostic or status signal from an amplitude-modulated current signal provided by HART modem 133 (see below), and vice versa. Terminal block 118 may, for instance, be provided with a HART connection for attaching a handheld diagnostic device. In other embodiments, HART modems 105 and 133 may be replaced by any other suitable data communication channel, e.g. via an $I^2C$ or serial peripheral interface (SPI) bus. Digital signal conditioner 106 comprises a digital filter which operates on digitized sensor signals, and which may be configurable by signal processor 104 in response to diagnostic programs or instructions from central control or monitoring system 26. Digital signal conditioner 106 may, for instance, operate to filter noise or extract signals of interest from the raw digitized signal provided by analog/digital converter 108. Analog/digital converter 108 is an analog-to-digital converter capable of digitizing analog sensor signals from transducer 16 corresponding to primary sensed variables. In some embodiments (such as in actuator systems) analog/digital converter 108 may alternatively or additionally comprise a digital-to-analog converter capable of converting digital signals from signal processor 104 into analog signals for transmission to transducer 16. Analog signal conditioner 110 is a conventional analog signal conditioner, which may for instance perform band-pass filtering to isolate one or more frequency regions of interest from signals received from transducer 16. Power supply control 112 is a conventional power routing device configured to draw power from terminal block 118. In some embodiments, power supply control 112 may receive an analog diagnostic report signal from terminal block 118 as a means for monitoring power quality and imminent power failure. In other embodiments, power module 120 may communicate with signal processor 104 exclusively via HART modems 105 and 133, or by a similar data bus. Signal processor 104 may process this diagnostic report, control transducer 16 at least in part based on the diagnostic signal, or simply forward the diagnostic report to control or monitoring system 26 via transceiver 102 and antenna 14 for archival and/or further processing. Power supply control 112 receives electrical power from local power source 22 and/or energy storage device via terminal block 118, and supplies this power as needed to transceiver 102, signal processor 104, digital signal conditioner 106, analog/digital converter 108, analog signal conditioner 110, and any other powered components of field device 12.

During operation, analog signal conditioner 110 receives and filters process signals from transducer 16. Transducer 16 may be situated inside field device 12, as depicted in FIG. 1, or may be located externally and connected to analog signal conditioner 110 by wire. Filtered process signals are digitized by analog/digital converter 108, and further filtered by digital signal conditioner 106 prior to processing by signal processor 104. Some embodiments of field device 12 may dispense with one or both of digital signal conditioner 106 and analog signal conditioner 110, particularly if signals from transducer 16 are preconditioned. Similarly, analog/digital converter 108 is unnecessary in embodiments wherein transducer 16 provides a digital signal. Although transceiver 102, signal processor 104, digital signal conditioner 106, analog/digital converter 108, and analog signal conditioner 110 have been described as distinct components, the functions of some or all of these components may in some embodiments be performed by shared hardware such as a common microprocessor. Field device 12 may also include a local operator interface (not shown) with, for instance, a screen and/or input keys allowing an operator to interact directly with field device 12. Like other powered components of field device 12, such a local operator interface would draw power from power supply control 112.

Powered components of field device 12 receive power from power supply control 112. Power supply control 112 in turn draws power from power module 120 through terminal block 118. Terminal block 118 is a power routing component configured to mate with and draw power from power module 120. Depending on the internal electronics of field device 12, terminal block 118 may accept AC or DC power. In some embodiments, terminal block 118 may serve to anchor power module within receptacle R. Terminal block 118 may be permanently affixed to field device 12, or may be a modular component which can be swapped out as needed, to provide an interface with alternative power sources.

Power module 120 is a hybrid device which provides power both from energy storage device 122, and from local power source 22. As illustrated in the embodiment shown in FIG. 2a, power module 120A comprises energy storage device 122, external source terminal 124 (with terminal screws 126), power conditioner 128, voltage sensors 130, power processor 132, HART modem 133, memory 134, and temperature sensor 136. FIG. 2b, by contrast, incorporates local power source 22 within power module 120B in the place of external source terminal 124, and therefore lacks both external source terminal 124 and terminal screws 126. Energy storage device 122 may be a capacitor, supercapacitor, rechargeable battery, primary (non-rechargeable) battery, or any other conventional compact energy storage device. Power conditioner 128 may include a capacitor, switching circuits, filtering components, and voltage and/or current limiting components. External source terminal 124 is a receiving terminal such as a conductive plate or tab to which power connection 24 is conductively secured via terminal screws 126 according to the embodiment depicted in FIG. 2a. In some alternative embodiments, power connection 24 may plug into or connect with external source terminal 124 by other means.

Although FIGS. 2a and 2b depict energy storage device 122 as a single unitary device, some embodiments of power module 120 may include multiple distinct power cells of the same or different types. Power conditioner 128 receives power from both energy storage device 122 and external source terminal 124 (FIG. 2a) or local power source 22 (FIG. 2b). Power conditioner 128 may draw power from sources simultaneously (e.g. supplementing power from local source 22 with stored power from energy storage device 122), or separately (e.g. powering field device 12 solely from local power source 22 when available, and from energy storage device 122 when external power is unavailable). Voltage sensors 130 provide power processor 132 with voltage readings of output power from energy storage device 122 and external source terminal 124 (FIG. 2a) or local power source 22 (FIG. 2b). Voltage sensors 130 are voltage transducers that produce a digital or analog signal reflecting the magnitude of through voltage provided by each source to power conditioner 128, and thereby of the availability of power from each source. Power processor 132 uses these sensed voltages to characterize local power source 22 and energy storage device 122 and diagnose current or incipient faults or variations in power supply in a diagnostic report transmitted to signal processor 104 via terminal block 118 and HART modems 133 and 105. In some embodiments, this diagnostic report may identify both local power source 22 and energy storage device 122 (e.g. with a serial number or type classification), flagging unanticipated drops in voltage from either source, and estimating remaining power and/or lifetime of energy storage 122 under current or predicted conditions.

Power processor 132 can, in some embodiments, identify source terminal 124 based on a characteristic voltage signal (e.g. a frequency spectrum corresponding to a particular source or source type). Energy storage device 122 can be similarly identified or classified based on its voltage output, particularly for embodiments of power module 120 wherein energy storage device 122 is a removable component (e.g. a commercial battery cell). Where energy storage 122 is permanently incorporated into power module 120, power processor 132 identifies energy storage 122 by retrieving a power source ID from memory 134, a machine-readable memory bank. Memory 134 can also store a database mapping voltage signatures to particular power source IDs or source types, and/or mapping particular voltage conditions to fault or alarm conditions to be reported in the diagnostic message to terminal block 118 and thereby to signal processor 104 and/or control or monitoring system 26.

According to one embodiment, processor 132 estimates remaining power available from energy storage device 122 based on its output voltage as sensed by voltage sensor 130, and on the identification of energy storage device 122 made by processor 132 or retrieved from memory 134. This remaining power estimate may be included in the diagnostic report to signal processor 104 and/or control or monitoring system 26, and/or used to generate a remaining lifetime estimate reflecting predicted time until energy storage device 122 is exhausted, using current, historical, and/or predicted conditions. In some embodiments, this remaining lifetime estimate is improved by the inclusion of temperature sensor 136, which is a temperature sensor disposed to provide power processor 132 with a temperature reading reflecting ambient temperature near energy storage device 122. Depletion rates of chemical batteries, in particular, are strongly temperature dependent; the inclusion of temperature sensor 136 allows processor 132 to produce a considerably more accurate estimate of depletion rates, and therefore remaining battery life. In some embodiments, memory 134 may store an archive of previous voltages sensed by voltage sensors 130, thereby enabling processor 132 to identify fault or changing conditions and predict remaining life of energy storage device 122 based on historical trends. Processor 132 can, for example, determine from archived voltage data that local power source 22 fully powers field device 12 half of the time (e.g. if local power source 12 is a vibrational energy harvester situated on a motor with a 50% duty cycle), and estimate remaining life of energy storage device 122 based on depletion rates accounting for the predicted availability of local power source, regardless of the current availability of power from local power source 22.

Although external source terminal 124, power conditioner 128, voltage sensors 130, power processor 132, HART modem 133, memory 134, and temperature sensors 136 are depicted as distinct logical components, in various embodiments any combination of these components may be incorporated into a common printed wiring board or similar unitary component.

Power conditioner 128 is a compact device which performs conventional power conditioning specific to local power source 22. Power conditioner 128 may, for instance, limit voltage and/or current so as to protect components of field device 12. Power conditioner 128 may also incorporate an AC/DC converter, where appropriate, if power source 22 is an AC power source. Power conditioner 128 may be fabricated as a part of printed wiring board 216, or may be a separate component attached to printed wiring board 216.

Power module 120 provides energy to terminal block 118 from two sources: energy storage device 122, and local power source 22. As discussed in the Background herein, external power sources such as energy scavenging systems and solar panels are often limited in the power they can supply. Some embodiments of local power source 22 can provide limited but substantially constant power insufficient to power signal processor 104, analog and digital signal conditioners 110 and 106, analog/digital converter 108, and particularly transceiver 102 at all times. Other embodiments of local power source 22 may provide greater but unreliable power. In either case, power module 120 supplements the power from local power source 22 with stored power from energy storage device 122 to meet the power requirements of powered components of field device 12. Depending on the environment and application of field device 12, more or less of the total power consumed by field device 12 may come from energy storage device 122 or local power source 22. Where power from local power source 22 is relatively scant or unreliable, field device 12 will be powered primarily from energy storage device 122, and supplemental power from local power source 22 will extend the lifetime of energy storage device 122. Where power from local power source 22 is relatively plentiful and reliable, field device 12 can be powered primarily from local power source 22, and supplemental power from energy storage device 122 will fill in for any downtimes or sags in power from local power source 22.

As noted above with respect to FIG. 1, local power source 22 may take a variety of forms. By way of example, a vibrational scavenger acting as local power source 22 may satisfy substantially all power requirements of field device 12 while the motor is active (e.g. half the time, with a 50% duty cycle). When the motor is inactive, power module 120 will instead provide power from energy storage device 122. In another embodiment, a thermoelectric energy scavenger acting as local power source 22 might provide constant but weak power sufficient to power signal processor 104, digital and analog signal conditioners 106 and 110, and analog/digital converter 108, but insufficient to power transceiver 102 during signal transmissions. In such a case, energy storage device 122 could provide supplemental power during transmissions. If local power source 22 could only provide even weaker power, energy storage device 122 might be required to power all components at all times. In such a case, the inclusion of local power source 22 could extend the expected lifetime of energy storage device 122, increasing time between replacement. In a third embodiment, a direct grid connection might constitute local power source 22. In such a case, external power source will completely power all components of field device 12 during ordinary conditions. Should the grid experience an outage, or the grid connection fail, energy storage device 122 will act as a backup power source, allowing field device 12 to continue to operate uninterrupted.

Although terminal block 118 and power module 120 are depicted as separate components in FIG. 2, some embodiments may combine the functions of terminal block 118 and power module 120 into a single removable component which attaches to field device 12 within receptacle R, and which is selected to match both the particular model of field device 12, and a particular type of local power source 22.

Figure 3:
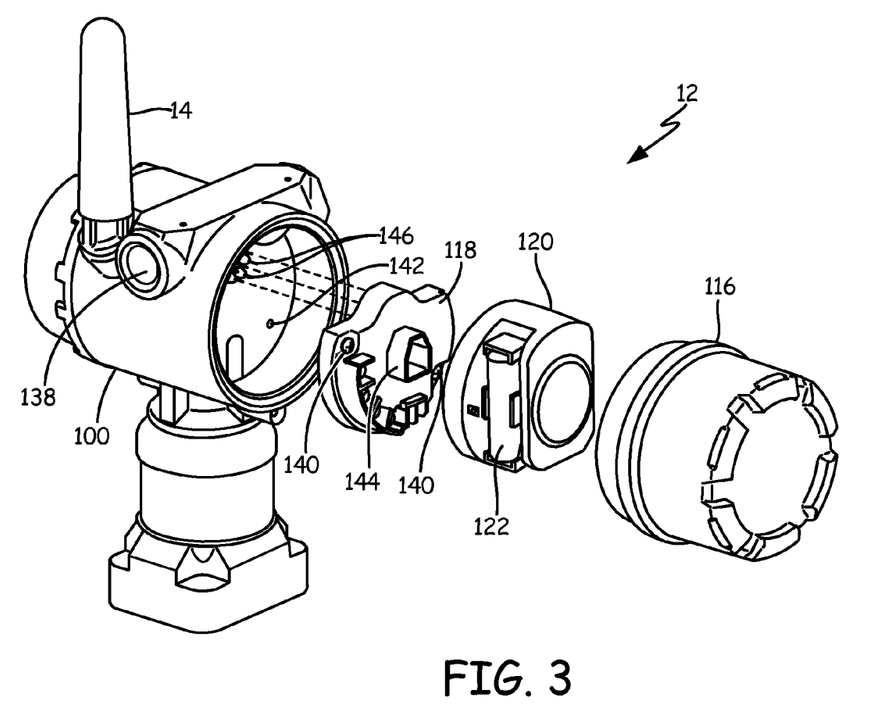
FIG. 3 is an exploded perspective view of the wireless field device of FIG. 1.

FIG. 3 is an exploded perspective view of one embodiment of field device 12, comprising antenna 14, casing or housing 100, cover 116, terminal block 118, power module 120, energy storage device 122, cable conduit 138, terminal block attachment screws 140, terminal block attachment screw holes 142, power source attachment 144, and power supply connector 146.

As discussed above with respect to FIGS. 2*a* and 2*b*, power supply control 112 provides power to all powered components of field device 12. Power supply control 112 receives electrical power from terminal block 118 via power supply connector 146, an electrical contact which interfaces with terminal block 118 when terminal block 118 is secured in place. Power supply connector 146 may, for instance, comprise a plurality of conductive pins which interface with corresponding recesses or jacks in terminal block 118. Furthermore, power supply connector 146 passes a diagnostic report (as described above with respect to FIGS. 2*a* and 2*b*) from power module 120 to power supply control 112. This diagnostic report may be a digital or analog signal. As depicted in FIG. 3, terminal block 118 is secured in contact with power supply connector 146 by terminal block attachment screws 140. Terminal block attachment screws 140 are threaded screws which fasten into terminal block attachment holes 142 on casing or housing 100, thereby removably anchoring terminal block 118. Although terminal block 118 is depicted as secured by terminal block attachment screws 140, alternative embodiments may use other means to secure terminal block 118, such as by bayonets or screws, or by a snap or friction fit. In alternative embodiments, terminal block 118 may be a non-removable component permanently affixed to, or mounted in, a wall of casing or housing 100 shared by receptacle R and internal space I. Terminal block 118 is equipped to receive AC or DC via one or more terminals. These terminals may take the form of flat conductive contacts which abut power module 120. Terminal block 118 is also, in the depicted embodiment, equipped to carry HART signals between HART modems 105 and 133, and vice versa.

Pursuant to this embodiment, power module 120 is secured to terminal block 118 by means of power source attachment 144. Power source attachment 144 is depicted as an electrical contact surrounded by a protruding sleeve on terminal block 118 which forms a snap or friction fit and an electrical contact with internal power module 120. In other embodiments, power source attachment 144 might comprise a hook, screw, latch, or any other conventional means for securing internal power module 120 to terminal block 118, together with any conventional electrical connection. Power source attachment 144 supports internal power module 120 in the absence of cover 116 (e.g. when cover 116 is removed to install or remove components within receptacle R). Cover 116 may, however, help to retain internal power module 120 against terminal block 118, as discussed below with respect to FIGS. 4*a* and 4*b*. Terminal block 118 may, where appropriate, provide power conditioning to regulate the voltage or current, and to invert or rectify power received from power module 120. Power module 120 provides power from local power source 22 and/or energy storage device 122. Power from power module 120 may originate exclusively from local power source 22 or energy storage device 122, or may come from a combination of both sources. In some embodiments, energy storage device 122 may be a rechargeable power source such as a capacitor or rechargeable battery, and may be charged from local power source 22.

As discussed above with respect to FIGS. 2*a* and 2*b*, energy storage device 122 may be a conventional battery or supercapacitor. Energy storage device 122 is depicted as removably coupled to power module 120 via a snap fit or other conventional locking mechanism. In other embodiments, power source 122 may be fully enclosed within power module 120, and may or may not be removable.

Power module 120 provides a contact point for power connection 24 from which it receives power from local power source 22. This contact point may comprise terminal screws 126 (see FIGS. 2*a* and 4*a*), or any equivalent attachment means for an electrical contact or connection to external source terminal 124. Terminal screws 126 are conductive fasteners used to attach one or more wires of power connection 24 to printed wiring board 216. Where power connection 24 includes hooks or loops, terminal screws 126 and printed wiring board 216 will interface with these hooks or loops to anchor power connection 24 to power module 122. Depending on the form of power connection 24 (which may in turn depend on power source 24), terminal screws 126 may be replaced with plug, clips, or other attachment means. Although FIG. 3 depicts terminal screws 126 for connecting power module 120 to an external embodiment of local power source 22, power module 120 may instead include an internal local power source 22*b* (see FIG. 2*b*). Such a local power source 22*b* could be located within power module 120, or attached to the exterior of power module 120 in such a manner as to fit under cover 116.

As described above with respect to the embodiment shown in FIG. 2, cover 116 meets casing or housing 100 in a seal, thereby protecting components within receptacle R (e.g. terminal block 118 and power module 120). Power module 120 fits snugly inside receptacle R, under cover 116 and in contact with terminal block 118. Local power source 22 is connected to power module 120 via power connection 24 (see FIGS. 2*a* and 2*b*), which extends through cable conduit 138 into receptacle R, and affixes to terminal screws 126 (or analogous fasteners). As described above, power module 120 includes power conditioner 128, which conditions power from local power source 22 and energy storage device 122 for use by powered components of field device 12. Power terminal 120 provides a diagnostic report to signal processor 104 and/or control or monitoring system 26 via power supply connector 146.

Figure 4A:
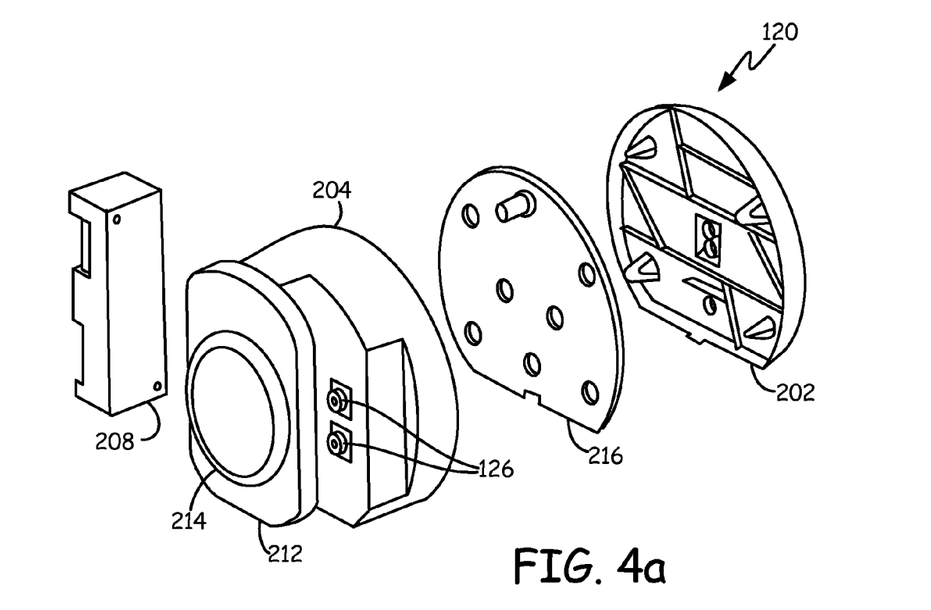
FIGS. 4a and 4b are exploded perspective views of a power module of the wireless field device of FIG. 1, from two angles.
Figure 4B:
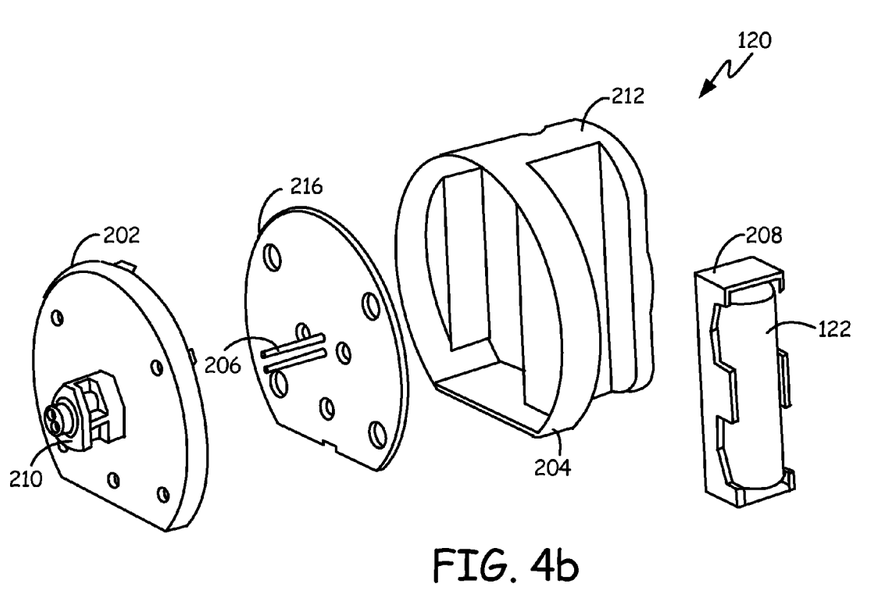

FIGS. 4*a* and 4*b* are exploded perspective views of one embodiment of power module 120 from two different angles. Power module 120 includes energy storage device 122, terminal screws 126, casing front 202, casing back 204, terminal posts 206, energy storage device attachment 208, friction fit connection 210, support 212, anchoring ring 214, and printed wiring board 216.

In this embodiment, power module casing 200 is a rigid protective enclosure which surrounds and printed wiring board 216, and which supports terminal screws 126 and energy storage device 122 snugly within receptacle R of field device 12. In the depicted embodiment, printed wiring board 216 is a circuit or microcomputer board on which external source terminal 124, power conditioner 128, voltage sensors 130, processor 132, memory 134, and temperature sensor 136 are all situated. In alternative embodiments, some or all of these components may be separate components housed within power module casing 200.

Terminal posts 206 are conductive posts which extend from power conditioner 128 on printed wiring board 216 through friction fit connection 210 of casing front 202 to form an electrical connection with power source attachment 144 of terminal block 118 (see FIG. 3). Friction fit connection 210 is a connecting portion of casing front 202 which extends into and mechanically attaches to power source attachment 144, thereby securing power module 120 to terminal block 118. Friction fit connection 210 may comprise one or more snap rings or similar components to form a snug connection to power source attachment 144.

According to this embodiment, energy storage device attachment 208 is a conventional snap-in battery housing, or an equivalent means for securing energy storage device 122. Energy storage device attachment 208 is anchored to casing back 204, and provides both mechanical retention and an electrical connection for energy storage device 122. As discussed above, energy storage device 122 may be a specialized energy cell, an off-the-shelf battery, a supercapacitor, or any similar energy storage device. The size and shape of energy storage device attachment 208 may vary depending on the type of energy storage device 122 selected. Energy storage device attachment 208 provides electrical contacts between energy storage device 122 and power conditioner 128 on printed wiring board 216.

Casing back 204 includes support 212, a substantially rigid portion extending away from printed wiring board 216 to meet with cover 116 (see FIG. 3), so as to provide a snug fit within receptacle R. This fit helps to hold friction fit connection 210 in place at power source attachment 144. In the depicted embodiment, support 212 includes anchoring ring 214, a raised circular ridge on the outermost surface of casing back 204. Anchoring ring 214 is sized to interface with a complementary ring or wave spring on the interior (not shown) of cover 116, thereby securing power module 120 against vibration, between terminal block 118 and cover 116. Terminal screws 126 extend through back casing 204 into printed wiring board 216, thereby providing an electrical interface for power connection 24 to local power source 22. For embodiments of field device 12 wherein local power source 22 is enclosed within receptacle R (see local power source 22b, described above with respect to FIG. 2b), terminal screws 126 may be omitted in favor of a direct connection between printed wiring board 216 and local power source 22 (if local power source 22 is included within power module 120), or a detachable hookup for local power source 22 conceptually similar to energy storage device attachment 208 (if local power source 22 is detachably affixed to power module 120). Alternatively, terminal screws 126 or similar attachment means may be used to connect printed wiring board 216 to an entirely separate local power source 22 housed between casing back 204 and cover 116. In this last embodiment, support 212 could be reduced to provide space for local power source 22.

Whether local power source 22 is housed within receptacle R or not, power module 120 provides an electrical connection which draws power preferentially from power source 22, and supplementally from energy storage device 122 when power from local power source 22 is unavailable or insufficient to satisfy the power needs of wireless device 12. Although particular applications or installation locations may result in either of power source 22 or energy storage device 122 providing the bulk of the power required by field device 12, field device 12 preferably draws power from local power source 22, when available, before depleting energy storage device 122. Power from each source is conditioned as needed by power conditioner 128, inverting or rectifying power from local power source 22 and energy storage device 122, as needed. In this way, power module 122 is able to provide continuous power for field device 12 despite varying availability of power from external power source 22, while extending the lifetime of energy storage device 122.

Figure 5:
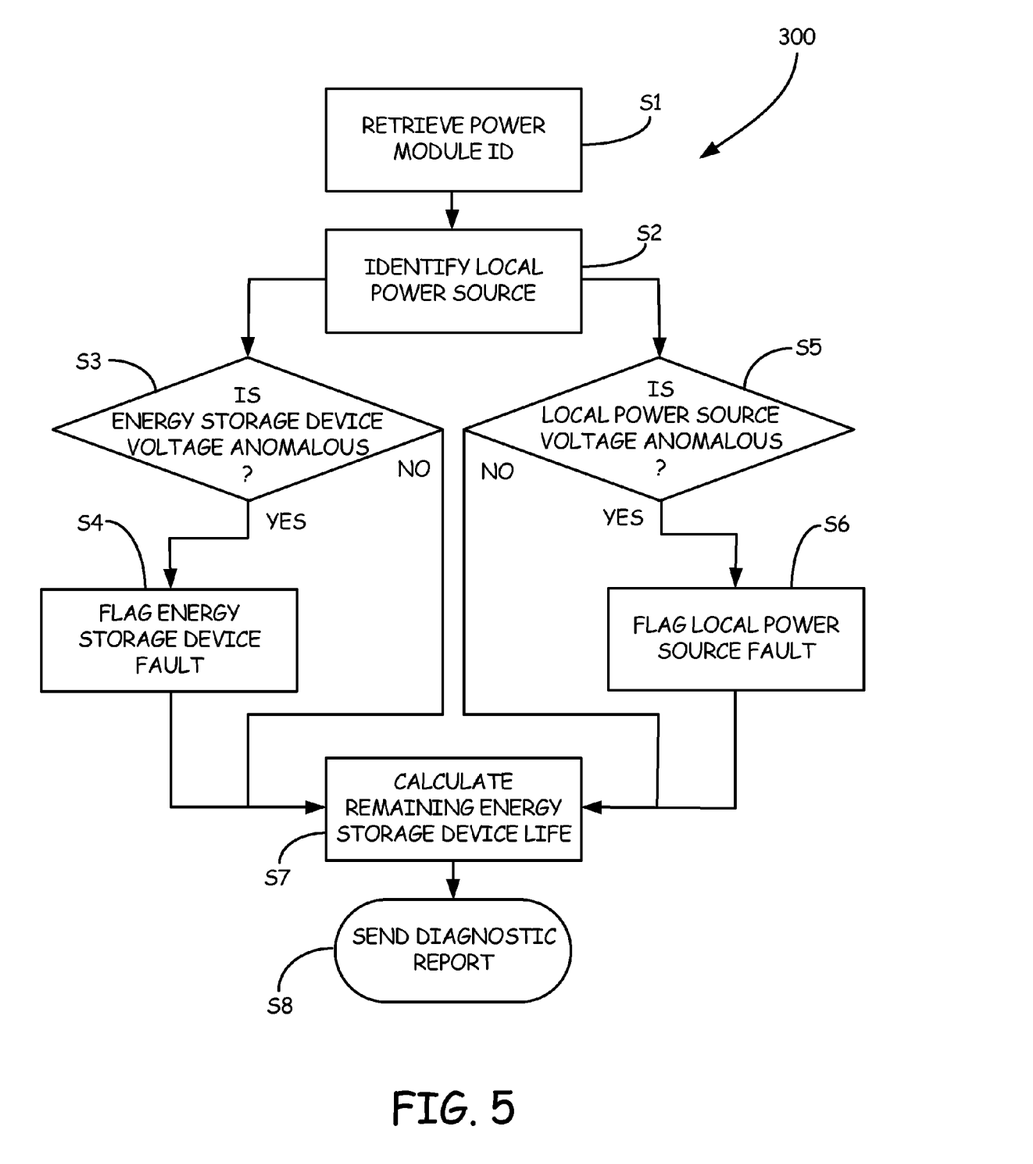
FIG. 5 is a flowchart of a diagnostics and fault detection method for the wireless field device of FIG. 1.

FIG. 5 is a flowchart of a method 300 for monitoring power supply status of local power source 22 and energy storage device 122. More particularly, method 300 describes one embodiment of a method whereby a diagnostic report is assembled by power module 120 and sent to signal processor 104 and/or control or monitoring system 26.

As discussed above with respect to FIGS. 2a and 2b, power processor 132 monitors output voltages of energy storage device 122 and external source terminal 124 or local power source 22, and preferably reports an identification of each power source, an estimated energy or lifetime remaining for energy storage device 122, and/or a fault flag or alert identifying fault or changing conditions in local power source 22 or energy storage device 122. In the depicted embodiment, power processor 132 first retrieves a power module ID for power module 120 from memory 134. (Step S1). This power module ID includes an identification of energy storage device, such as a serial number, capacity, or type. Power processor 132 then similarly identifies local power source 22 by matching its output voltage signature (e.g. by amplitude or Fourier-transformed frequency characteristics) to a stored profile in a signature database loaded into memory 134. (Step S2). In embodiments of power module 120 wherein energy storage device 122 is a removable component, rather than an integral part, energy storage device 122 may be likewise be identified based on its sensed voltage signature, and not retrieved directly from memory 134. Power processor 132 determines whether energy storage device output voltages are anomalous by comparing instantaneous sensed output voltages and/or changes in output voltage over time with predicted values associated in memory 134 with the identification made in step S1. (Step S3). If the energy storage device exhibits anomalous voltages, such as low voltages indicating depletion beyond a threshold level or imminent complete depletion, power processor 132 flags an energy storage device fault. (Step S4). In some embodiments, power processor 132 may be capable of flagging a plurality of distinct energy storage device alert corresponding to different device conditions (e.g. a short circuit, 50% battery depletion, 90% battery depletion, unexpectedly rapid depletion above a threshold value, etc.). Power processor 132 similarly determines whether local power source voltages or changes in voltage over time are anomalous based on sensed output voltage of local external source terminal 124 (in the embodiment of FIG. 2a) or local power source 22 (in the embodiment of FIG. 2b). (Step S5). Anomalous voltages may, for instance, reflect failure of local power source 22, or insufficiency of power from local power source 22. As with energy storage device 122, power processor 132 flags any faults or variations in local power source 124. (Step S6). Flagged energy storage device and local power source faults or alerts are stored in memory 134. These faults may be stored only temporarily, or may be archived in memory 134 for later detailed diagnostics.

Power processor 132 also preferably calculates estimated remaining life of energy storage device 122 by estimating remaining charge and expected depletion rate of energy storage device 122 based on current and historical voltage readings from voltage sensors 130, from identifications of local power source 22 and energy storage device 122 performed in steps S1 and S2, and based on readings from temperature sensor 136. (Step S7). Power processor 132 then sends a diagnostic report including this estimated remaining life and any flagged faults or alerts to signal processor 104 and/or control or monitoring system 26 via terminal block 118. (Step S8). In some embodiments, the diagnostic report may also include the identifications made in steps S1 and S2, and the estimates of remaining charge and expected depletion rate made in step S7. The diagnostic report may, for instance, comprise a modulated voltage output provided to terminal block 118 by power processor 132.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A wireless field device assembly comprising:
    a process sensor configured to monitor a process variable and produce a sensor signal;
    a housing enclosing an interior space of the wireless field device;
    a transmitter enclosed within the interior space, and configured to process the sensor signal; and
    a power module configured to be housed in the interior space, removable from the interior space as a unit, the power module comprising:
        first and second voltage sensors configured to sense first and second output voltages of the energy storage device and the local power source, respectively;
        an energy storage device;
        a connection to a local power source; and
        a processor configured to provide the transmitter with a diagnostic report of the energy storage device and the local power source, wherein the diagnostic report comprises an identification of at least one of the energy storage device and the local power source based on the first and second output voltages.

2. The wireless field device assembly of claim 1, wherein the diagnostic report comprises a fault report indicating incipient or current faults in the energy storage device or the local power source, based on the first and second output voltages.

3. The wireless field device assembly of claim 2, wherein the fault report reflects an unanticipated drop in voltage from the energy storage device, the local power source, or both.

4. The wireless field device assembly of claim 1, wherein the power module further comprises a machine readable memory, and the identification of at least one of the energy storage device and the local power source comprises an identification of the energy storage device retrieved from the machine readable memory.

5. The wireless field device assembly of claim 1, wherein the diagnostic report comprises a projected remaining life of the energy storage device based on the first and second output voltages.

6. The wireless field device assembly of claim 5, wherein the local power source further comprises a temperature sensor configured to produce an ambient temperature reading, and wherein the projected remaining life of the energy storage device is further based on the ambient temperature reading.

7. The wireless field device assembly of claim 1, wherein the power module is configured to draw power preferentially from the local power source connection, and supplementally from the energy storage device when power from the local power source is unavailable or insufficient to satisfy power demand.

8. The wireless field device assembly of claim 1, wherein the power module houses the local power source.

9. The wireless field device assembly of claim 1, wherein the local power source is situated externally to the power module, and connected to the power module via an external source terminal of the power module.

10. The wireless field device assembly of claim 1, further comprising a cover defining a receptacle between the housing and the cover, and wherein the power module is configured to be housed in the receptacle.

11. The wireless field device assembly of claim 10, wherein the power module is configured to be removably housed in the receptacle.

12. The wireless field device assembly of claim 1, wherein the energy storage device is a battery or a supercapacitor.

13. The wireless field device of claim 1, wherein the local power source is an energy harvesting device.

14. The wireless field device of claim 1, wherein the power module further comprises a power conditioner that conditions power from at least one of the energy storage device and the local power source.

15. The wireless field device assembly of claim 14, wherein the power conditioner is configured to rectify or invert power from at least one of the energy storage device and the local power source.

16. The wireless field device assembly of claim 1, wherein the transmitter is configured to send the sensor signal and the diagnostic report to a control or monitoring system.

17. A power monitoring and diagnostic method for a power module for a process variable transmitter with an energy storage device and a local power source connection to a local power source, the method comprising:
    sensing within the power module a first output voltage of the local power source and a second output voltage of the energy storage device;
    flagging fault or changing conditions corresponding to output voltages of the local power source and the energy storage device;
    estimating a remaining energy storage device life based on the first and second output voltages;
    identifying at least one of the local power source and the energy storage device based on at least one of the first and second output voltages; and
    transmitting a diagnostic report including the estimated remaining energy storage device life, the flagged fault conditions, and the identification of the identification of at least one of the local power source and the energy storage device.

18. The method of claim 17, wherein estimating the remaining energy storage device life comprises estimating expected depletion rate and remaining charge of the energy storage device, and determining remaining energy storage device life from the estimated expected depletion rate and remaining charge.

19. The method of claim 17, wherein identifying at least one of the local power source and the energy storage device comprises identifying the local power source based on the first output voltage.

20. The method of claim 19, wherein identifying the local power source based on the first output voltage comprises matching a voltage signature of the first output voltage with a local power source identification using a database of voltage signatures.

21. The method of claim 17, wherein identifying at least one of the local power source and the energy storage device comprises identifying the energy storage device.

22. The method of claim 21, wherein identifying the energy storage device comprises matching a voltage signature of the second output voltage with an energy storage device identification using a database of voltage signatures.

23. The method of claim 21, wherein identifying the energy storage device comprises retrieving a stored identification of the power module that includes an identification of the energy storage device.

24. The method of claim 21 wherein the expected depletion rate is further based on a sensed temperature.

25. A wireless field device assembly comprising:
- a process sensor configured to monitor a process variable and produce a sensor signal;
- a housing enclosing an interior space of the wireless field device;
- a transmitter enclosed within the interior space, and configured to process the sensor signal; and
- a power module configured to be housed in the interior space and removable from the interior space as a single unit, the power module comprising:
  - a connection to a local power source from which the power module draws power preferentially;
  - an energy storage device from which the power module draws power supplementally, when power from the local power source is unavailable or insufficient to satisfy power demand;
  - first and second voltage sensors configured to sense first and second output voltages of the energy storage device and the local power source, respectively; and
  - a processor configured to provide the transmitter with a diagnostic report comprising an identification of at least one of the energy storage device and the local power source based on the first and second output voltages.

* * * * *